(12) United States Patent
Salle et al.

(10) Patent No.: US 10,496,040 B2
(45) Date of Patent: Dec. 3, 2019

(54) DIGITAL SYNTHESIZER, COMMUNICATION UNIT AND METHOD THEREFOR

(71) Applicant: NXP USA, Inc., Austin, TX (US)

(72) Inventors: Didier Salle, Toulouse (FR); Olivier Vincent Doare, La Salvetat St Gilles (FR); Birama Goumballa, Larra (FR); Cristian Pavao Moreira, Frouzins (FR)

(73) Assignee: NXP USA, Inc., Austin, TX (US)

( * ) Notice: Subject to any disclaimer, the term of this patent is extended or adjusted under 35 U.S.C. 154(b) by 200 days.

(21) Appl. No.: 15/715,315

(22) Filed: Sep. 26, 2017

(65) Prior Publication Data
US 2018/0181077 A1 Jun. 28, 2018

(30) Foreign Application Priority Data
Dec. 22, 2016 (EP) .................................... 16306797

(51) Int. Cl.
*G04F 10/00* (2006.01)
*H03L 7/085* (2006.01)
(Continued)

(52) U.S. Cl.
CPC ............ *G04F 10/005* (2013.01); *G01S 7/032* (2013.01); *G01S 7/35* (2013.01); *G01S 7/4008* (2013.01);
(Continued)

(58) Field of Classification Search
CPC ... G04F 10/005; H03L 2207/50; H03L 7/085; H03L 7/091; G01S 13/343; G01S 13/34; G01S 13/345; H03C 3/0933
See application file for complete search history.

(56) References Cited

U.S. PATENT DOCUMENTS 6,501,706 B1 * 12/2002 West ....................... G04F 10/00
368/118
7,884,751 B2 * 2/2011 Shimizu .................. G04F 10/06
327/269
(Continued)

FOREIGN PATENT DOCUMENTS

CN    104320130 A    1/2015

OTHER PUBLICATIONS

Samarah, et al., "A Digital Phase-Locked Loop With Calibrated Coarse and Stochastic Fine TDC," IEEE Journal of Solid-State Circuits, vol. 48, No. 8, Aug. 2013, 13 pages.

*Primary Examiner* — Ryan Johnson

(57) ABSTRACT

A digital synthesizer includes a ramp generator that generates a signal of frequency control words, FCW, that describes a desired frequency modulated continuous wave; a digitally controlled oscillator, DCO, that receives the FCW signal and outputs a DCO signal; and a feedback loop that includes a dual time-to-digital converter, TDC, circuit to measure a delay between a representation of the DCO signal and a reference signal. The TDC circuit comprises a medium-resolution TDC circuit coupled to a fine-resolution TDC circuit; and a phase comparator coupled to the ramp generator that compares a phase of the FCW signal output from the ramp generator and a signal fed back from the DCO via the feedback loop and output a N-bit oscillator control signal. The medium-resolution TDC circuit comprises a plurality of individual delay cells, where each of the plurality of individual delay cells is coupled to a respective individual fine-resolution TDC circuit.

14 Claims, 7 Drawing Sheets

(51) Int. Cl.
  *G01S 13/34* (2006.01)
  *G01S 7/40* (2006.01)
  *G01S 7/03* (2006.01)
  *G01S 7/35* (2006.01)
  *H03L 7/16* (2006.01)
  *G01S 13/28* (2006.01)
(52) U.S. Cl.
  CPC ............ *G01S 13/343* (2013.01); *H03L 7/085* (2013.01); *G01S 13/282* (2013.01); *H03L 7/16* (2013.01); *H03L 2207/50* (2013.01)

(56) References Cited

U.S. PATENT DOCUMENTS

| | | |
|---|---|---|
| 7,932,847 B1 | 4/2011 | Hsieh et al. |
| 9,490,831 B2* | 11/2016 | Kim ........................ H03L 7/189 |
| 2007/0273569 A1 | 11/2007 | Lin |
| 2008/0129574 A1 | 6/2008 | Choi et al. |
| 2013/0050013 A1* | 2/2013 | Kobayashi ............ G01S 13/343 342/118 |
| 2014/0292552 A1 | 10/2014 | Kim et al. |

* cited by examiner

DIGITAL SYNTHESIZER, COMMUNICATION UNIT AND METHOD THEREFOR

FIELD OF THE INVENTION

The field of the invention relates to a digital synthesizer having a digitally controlled oscillator in a digital phase locked loop circuit (DPLL), a communication unit and a method therefor. In particular, the field relates to an all-digital PLL (ADPLL) for a frequency modulated continuous wave (FMCW) radar device in order to provide a high-resolution time-to-digital converter.

BACKGROUND OF THE INVENTION

In many present day wireless communication applications, a digital synthesizer is used and often implemented by way of a digital phase locked loop (DPLL) that is used to control a digitally controlled oscillator (DCO) to generate (often referred to as 'synthesize') an output radio frequency (local oscillator) signal. Such digital synthesizers provide the benefit of simplifying the integration of the synthesizer circuitry within large scale integrated digital circuit devices, as compared with equivalent analogue synthesizers, thereby reducing size, cost, power consumption and design complexity. Furthermore, DPLLs intrinsically present lower phase noise than their analogue counterparts.

All-digital phase locked loops (ADPLLs) can be used as a frequency synthesizer in radio frequency circuits to create a stable local oscillator for transmitters or receivers, due to their low power consumption and high integration level. They can also be used to generate the frequency-modulated continuous wave (FMCW) waveforms required by a radar transmitter.

FIG. 1 illustrates a conventional digital phase locked loop (DPLL) 100. An N-bit digital FCW 105 is provided to a phase comparator 110, which compares an N-bit digital feedback signal 155 to the FCW 105, and outputs an N-bit oscillator control signal 115 based on the comparison of the digital feedback signal 155 to the FCW 105. A digital low pass filter 120 filters the N-bit oscillator control signal 115, and outputs a filtered N-bit oscillator control signal 125, which is provided to a digitally controlled oscillator (DCO) 130. For completeness, it is noted that a portion of the DCO may reside in the analog domain for radar applications that require very good phase noise. The DCO 130 outputs a frequency signal 135 based on the filtered N-bit oscillator control signal 125. A feedback path of the DPLL 100 consists of a divider 140 that divides the output frequency signal 135 to generate a frequency-divided signal 145, which is provided to a time-to-digital converter (TDC) 150. The TDC 150 also receives a reference frequency signal 165, which is used to sample the frequency-divided signal 145. The TDC 150 outputs the N-bit digital feedback signal 155 based on a measured time interval between the frequency-divided signal 145 and the reference frequency signal 165.

In ADPLLs, one of the key building blocks is the Time-to-Digital converter (TDC). The TDC circuit measures the oscillation period of the DCO using the reference frequency period as a reference. The most important parameters in the TDC circuit are its resolution, time dynamic range and linearity. In this context, the time resolution must be as low as possible, as it is the limiting factor to achieve very low in-band phase-noise levels that are required in high performance applications. The time-to-digital converter (TDC) must also be able to measure, with the above-mentioned low time resolution, a sufficiently long DCO period. Lastly, the TDC response, i.e. the output code versus the input time, must be linear.

Solutions exist that provide either a low resolution or a long DCO period, but not both at the same time. Accordingly, a need exists to provide a synthesizer circuit and a method to achieve both of these requirements.

Known ADPLLs have rarely been used in FMCW radar systems and devices, as yet, due to the extremely demanding phase-noise performances that are required in such systems and devices, and also very demanding level of spurious signals that are needed, which are extremely difficult to attain with an ADPLL. The known technique disclosed in CN 104320130 A describes a dual TDC circuit that includes one medium-resolution TDC circuit that uses a tapped delay-line (based on an inverter delay) and one fine-resolution TDC circuit that uses a Vernier delay-line. The proposed architecture in this document requires a significant amount of analog circuitry (namely three delay locked loops (DLLs), two phase-detectors plus charge-pumps and loop filters, an analog OR gate, replica delay, etc.) between the medium-resolution TDC circuit and the fine-resolution TDC circuit. Such a complex design is used to attempt a smooth handover from the medium to fine TDC, as well as to calibrate both TDC circuits. However, due to the handover from the medium TDC to the fine TDC operation the architecture fails to provide linearity of the generated signal in a long DCO period and a low resolution cannot be achieved. Furthermore, such a solution is both costly and die-consuming.

U.S. Pat. No. 7,932,847 B1 also describes a dual TDC circuit that includes one medium-resolution and one fine-resolution circuit that uses two delay-lines. This solution includes a complex analog circuit of a time-based amplifier between the medium-resolution TDC circuit and the fine-resolution TDC circuit in order to attempt a smooth handover from the medium to fine TDC. The time-based amplifier requires additional calibration. The use of complex analog circuitry may generate errors during the calibration, which yields a degradation of the fine-resolution performance. These known TDC architectures may also create linearity problems when jumping from medium TDC to a fine TDC.

SUMMARY OF THE INVENTION

The present invention provides a digital synthesizer, a communication unit, such as a radar device, and a method therefor as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
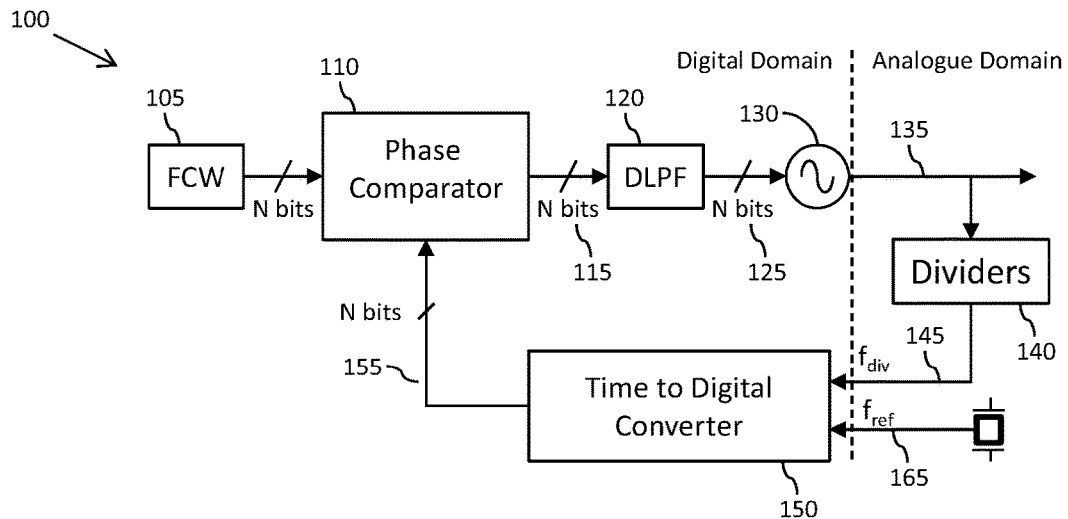
FIG. 1 illustrates a conventional digital phase locked loop design.

In accordance with some example embodiments of the present invention, there is provided a digital synthesizer and a method of generating a digital oscillator signal. In examples of the invention, the digital synthesizer includes a dual TDC that combines a medium-resolution, high time dynamic range TDC with a fine-resolution TDC that includes a set of very low resolution, short dynamic range TDC cells.

In some examples, the medium-resolution TDC includes a number of individual delay cells, each cell exhibiting a medium resolution of the order of magnitude of one or more unit inverter delay in the used technology. Thus, in this context, a medium-resolution TDC encompasses providing a resolution of at least one DCO period. In the medium-resolution TDC, the term cell (or unit cell) encompasses any mechanism that can be employed to implement a delay, such as an inverter or a buffer. In examples of the invention, the 'cell' may be employed to introduce a delay of an order of, say, a 1 nsec. period. In examples of the invention, each individual delay cell of a plurality of delay cells of the medium-resolution TDC circuit is coupled to a respective individual fine-resolution TDC circuit. In this manner, each respective individual fine-resolution TDC circuit performs a further fine-resolution on each output of the plurality of delay cells of the medium-resolution TDC circuit, thereby providing a much more accurate signal alignment than known TDC circuits. In this context, a fine-resolution TDC circuit provides a resolution that is far below the unit inverter delay available in the technology employed, but where the period that is measured is only (at least) the time delay of the medium-resolution TDC unit delay cell. This advantageously removes any need for complex analog alignment circuitry located between medium-resolution TDC circuit and fine-resolution TDC circuits.

In some examples, a set of fine-resolution TDCs also includes a number of individual delay cells as a corresponding companion to each unit delay cell of the medium-resolution TDC. In some examples, the set of fine-resolution TDCs may use, say, flash topology.

Although examples of the invention are described with respect to digital PLLs, it is envisaged that such concepts may be employed in any synthesizer that generates a synthesized signal, and requires fine signal resolution, a relatively long time dynamic range and linearity.

Although examples of the invention are described with reference to a use of a TDC in a radar application, such as a 77 GHz radar system, it is envisaged that the TDC concept may be used in a low-frequency application. In such applications, the DCO signal itself may be used, rather than a frequency-divided version that is used in the example embodiments. Consequently, the concepts described herein encompass both implementations, where a TDC circuit may be used to recognize events and provide a digital representation of the time that the event occurred, e.g. determining a time interval between two signal pulses (e.g. a start pulse and a stop pulse).

Figure 2:
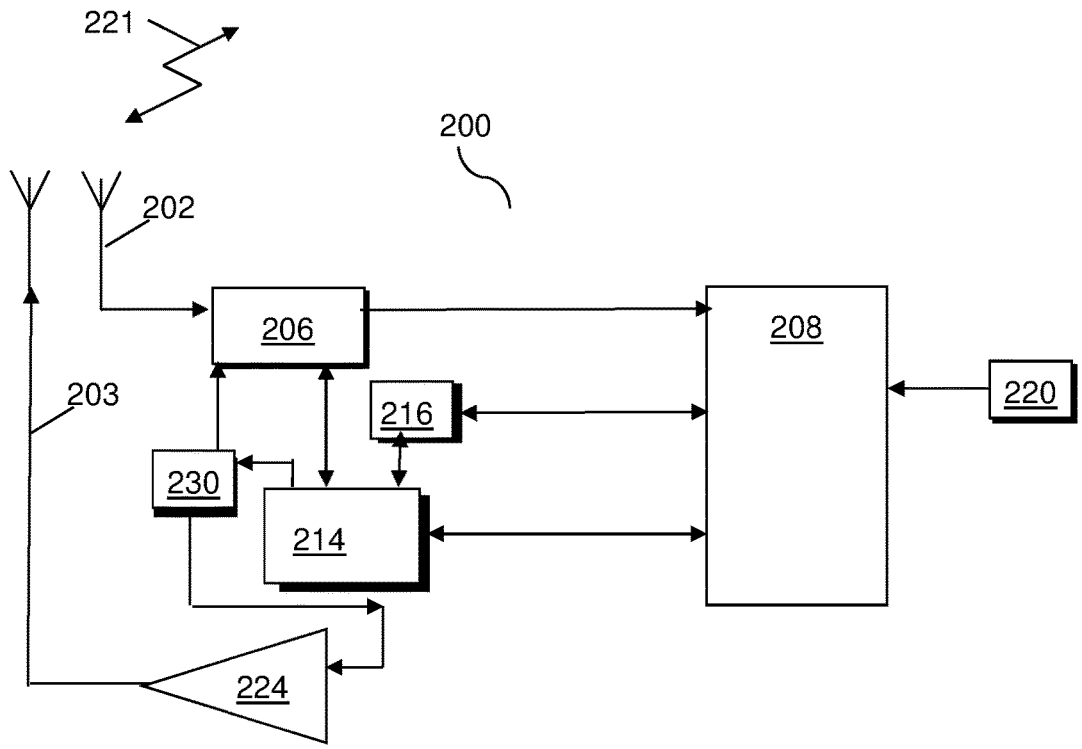
FIG. 2 illustrates a simplified block diagram of a radar device, adapted in accordance with examples of the invention.

Referring to FIG. 2, a block diagram of an example wireless communication unit is shown, adapted in accordance with some examples of the invention. Purely for explanatory purposes, the wireless communication unit is described in terms of a radar device 200 operating at millimeter wave (MMW) frequencies. The radar device 200 contains one or several antennas 202 for receiving radar signals 221, and one or several antennas 203 for transmitting radar signals, with one shown for each for simplicity reasons only. The number of antennas 202, 203 used may depend on the number of radar receiver and transmitter channels that are implemented in a given radar device. One or more receiver chains, as known in the art, include receiver front-end circuitry 206, effectively providing reception, frequency conversion, filtering and intermediate or base-band amplification, and finally an analog-to-digital conversion. In some examples, a number of such circuits or components may reside in signal processing module 208, dependent upon the specific selected architecture. The receiver front-end circuitry 206 is coupled to the signal processing module 208 (generally realized by a digital signal processor (DSP)). A skilled artisan will appreciate that the level of integration of receiver circuits or components may be, in some instances, implementation-dependent.

The controller 214 maintains overall operational control of the radar device 200, and in some examples may comprise time-based digital functions (not shown) to control the timing of operations (e.g. transmission or reception of time-dependent signals, FMCW modulation generation, etc.) within the radar device 200. The controller 214 is also coupled to the receiver front-end circuitry 206 and the signal processing module 208. In some examples, the controller 214 is also coupled to a memory device 216 that selectively stores operating regimes, such as decoding/encoding functions, and the like.

As regards the transmit chain, this essentially comprises a power amplifier (PA) 224 coupled to the transmitter's one or several antennas 203, antenna array, or plurality of antennas. In radar device 200, radar transceiver topology is different from traditional wireless communication architectures (e.g. Bluetooth™, WiFi™, etc.), as modulation occurs within a phase locked loop (PLL) (typically via a fractional-N divider), and is applied directly to the PA 224. Therefore, in some examples, the receiver front-end circuitry 206 and transmitter PA 224 are coupled to frequency generation circuit 230 arranged to provide local oscillator signals. The generated local oscillator signals are thus modulated directly to generate transmit radar signals, and also used to down-convert received modulated radar signals to a final intermediate or baseband frequency or digital signal for processing in a receive operation.

Figure 3:
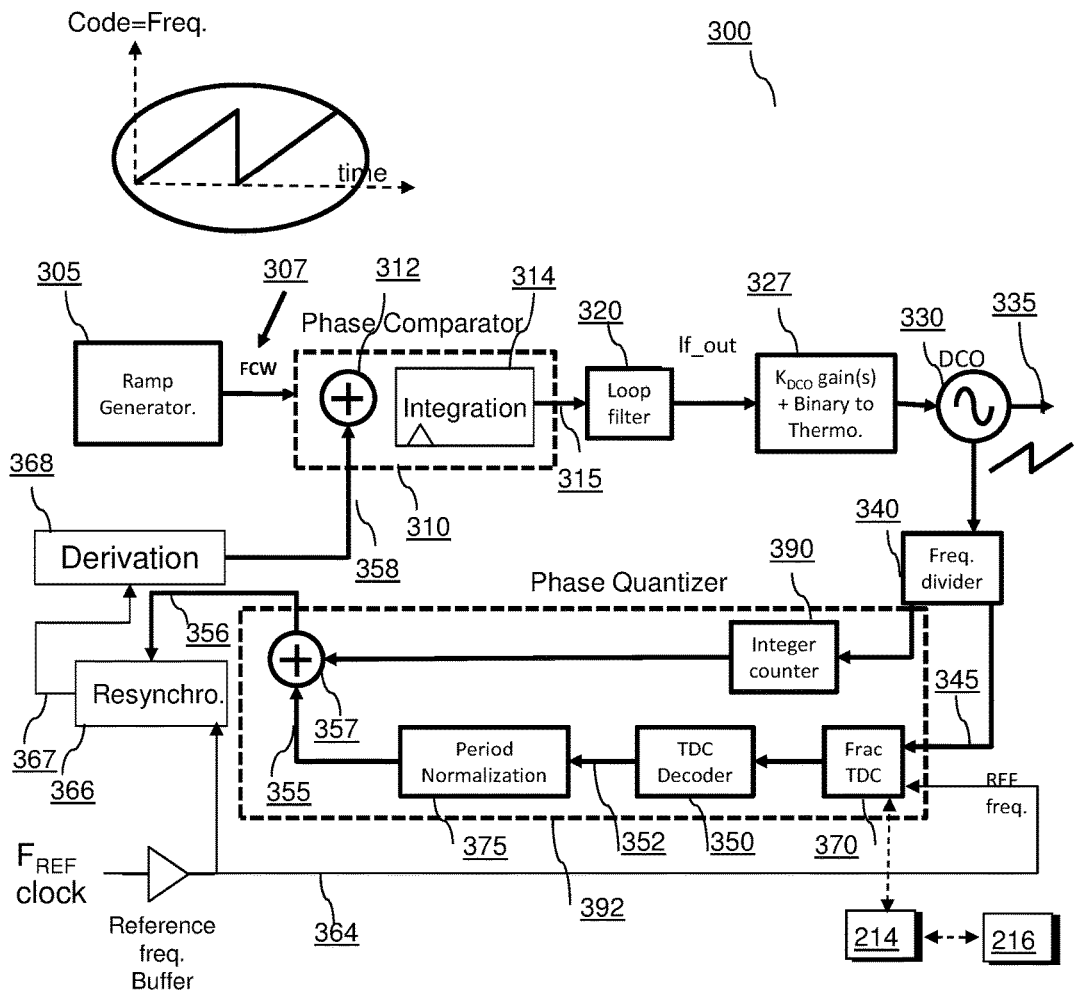
FIG. 3 illustrates a simplified circuit diagram of an example of a digital phase locked loop (DPLL) in accordance with examples of the invention.

In accordance with examples of the invention, frequency generation circuit 230 includes a digital synthesizer comprising a digitally controlled oscillator, DCO; a feedback loop; a ramp generator configured to generate a signal of frequency control words, FCW, that describes a desired frequency modulated continuous wave; and a phase comparator configured to compare a phase of the FCW output from the ramp generator and a signal fed back from the DCO via the feedback loop and output a N-bit oscillator control signal, as described with reference to FIG. 3. The digital synthesizer includes a dual TDC that includes both a medium-resolution TDC that provides a resolution of at least one DCO period, and thereafter a fine-resolution TDC that provides an improved resolution but where the period that is measured is only (at least) the time delay of the medium-resolution TDC.

In FIG. 2, a single signal processor may be used to implement a processing of receive signals. Clearly, the various components within the radar device 200 can be realized in discrete or integrated component form, with an ultimate structure therefore being an application-specific or design selection.

A skilled artisan will appreciate that the level of integration of circuits or components may be, in some instances, implementation-dependent.

FIG. 3 illustrates a simplified block diagram of a first example of a digital synthesizer, and more specifically a digital phase locked loop (DPLL) 300 that includes a digitally controlled oscillator (DCO) 330, in accordance with examples of the invention. In some examples, the DPLL 300 may form part of the frequency generation circuit 230 of FIG. 2. In some examples, a modulation generator, which in the illustrated example is a ramp generator 305, is configured to generate frequency control words (FCW) in a form of an N-bit digital FCW signal 307 that describe the wanted frequency modulated continuous waveform (FMCW) ramps. The N-bit digital FCW signal 307 is provided to a phase comparator 310, which compares an N-bit digital feedback signal 358 to the FCW signal 307, and outputs an N-bit oscillator control signal 315 based on the comparison of the digital feedback signal 358 to the FCW signal 307. A digital low pass filter 320 filters the output N-bit oscillator control signal 315, and outputs a filtered N-bit oscillator control signal to a loop gain circuit 327, which in this example is identified as a KDCO gain(s)+ Binary to thermometer gain circuit, where KDCO is the DCO gain. In essence, this results in a multiplication of a fixed gain (Kdco) that comes from a calibration of the DCO, in order to track the DCO gain. Thereafter, a decoder converts binary code into thermometer code in order to control the DCO, as the DCO needs this type of data format.

The DCO 330 outputs a frequency signal 335 based on the filtered oscillator control signal output from the gain circuit 327. In some examples, a representation of the DCO signal itself may be fed back and compared with the reference signal. In this example, however, and assuming an application for, say, a 77 GHz radar unit, a frequency-divided DCO signal is used. Thus, a feedback path of the DPLL 300 consists of an optional frequency divider 340 that divides the output frequency signal 335 to generate a frequency-divided signal 345, which is provided to a phase quantizer circuit 392.

In accordance with examples of the invention, the phase quantizer circuit 392 includes a fractional time-to-digital converter (TDC) configured to receiving the frequency-divided signal 345. The TDC circuit 370 aims to process the fractional part of Fdco/Fref. Thus, the integer part is generated from the integer counter 390 and the fractional part from the TDC circuit 370. In some examples, the feedback path may not employ the optional frequency divider 340, such that the TDC circuit 370 measures a delay between the DCO signal itself 335 and a reference signal 364. Hereafter, the expression 'determining a delay between a representation of the DCO signal' encompasses these alternative options of determining a delay between either the DCO signal itself or the frequency-divided signal 345 and the reference signal 364.

In accordance with examples of the invention, the fractional TDC is a dual TDC 370 that includes both a medium-resolution TDC circuit that provides a resolution of at least one DCO period, and thereafter a fine-resolution TDC circuit that provides an improved resolution, but where the period that is measured is only (at least) the time delay of the medium-resolution TDC circuit. In some examples, a controller, such as controller 214 in FIG. 2, may be used to implement a dynamic element matching (DEM) algorithm in order to control or select one or more capacitive element(s) in the fine-resolution TDC circuit. The DEM algorithm, and/or capacitive data relating thereto, may be stored in memory, such as in memory device 216 in FIG. 2.

The dual TDC 370 also receives a reference (clock) frequency signal 364 that is used to sample the frequency-divided signal 345. The dual TDC circuit 370 routes the digital feedback signal to a TDC decoder 350 that processes and decodes the digital feedback signal only to a fine-resolution TDC and outputs the decoded digital feedback signal 352 to a period normalisation circuit 375 configured to provide the result of the fractional TDC measurement normalized to a period of the DCO frequency-divided signal 345.

The fractional TDC result, once normalized to the DCO divided-down period 355, is input to an adder 357, where it is added with an output from integer counter 390 that also receives the frequency-divided signal 345. The adder 357 outputs a digital signal 356, which consists of the integer and fractional ratio between the reference frequency and DCO frequency-divided signal 345.

All operations in the DPLL must be synchronized with the reference frequency and in practice DPLL operations generate delays and have to be synchronous. In accordance with some examples of the invention, the digital signal 356 is therefore input to a re-synchronization circuit 366, which is configured to re-synchronize the frequency-divided signal 345 to the reference frequency 364.

The re-synchronization circuit 366 outputs a re-synchronized digital signal 367 to a derivation circuit 368, which switches the fed back signal from a phase domain to a frequency domain. The derivation circuit 368 then provides the feedback signal 358 to the phase comparator 310.

In some examples, the phase comparator 310 includes an adder 312 that combines the feedback signal 358 with the N-bit digital FCW signal 307 and provides the summed signal to an integration circuit 314. In this manner, the comparison is performed between frequencies, and the adder 312 and integration circuit 314 switch the frequency domain signal back to the phase domain before filtering. The output of the integration circuit is the N-bit oscillator control signal 315.

Figure 4:
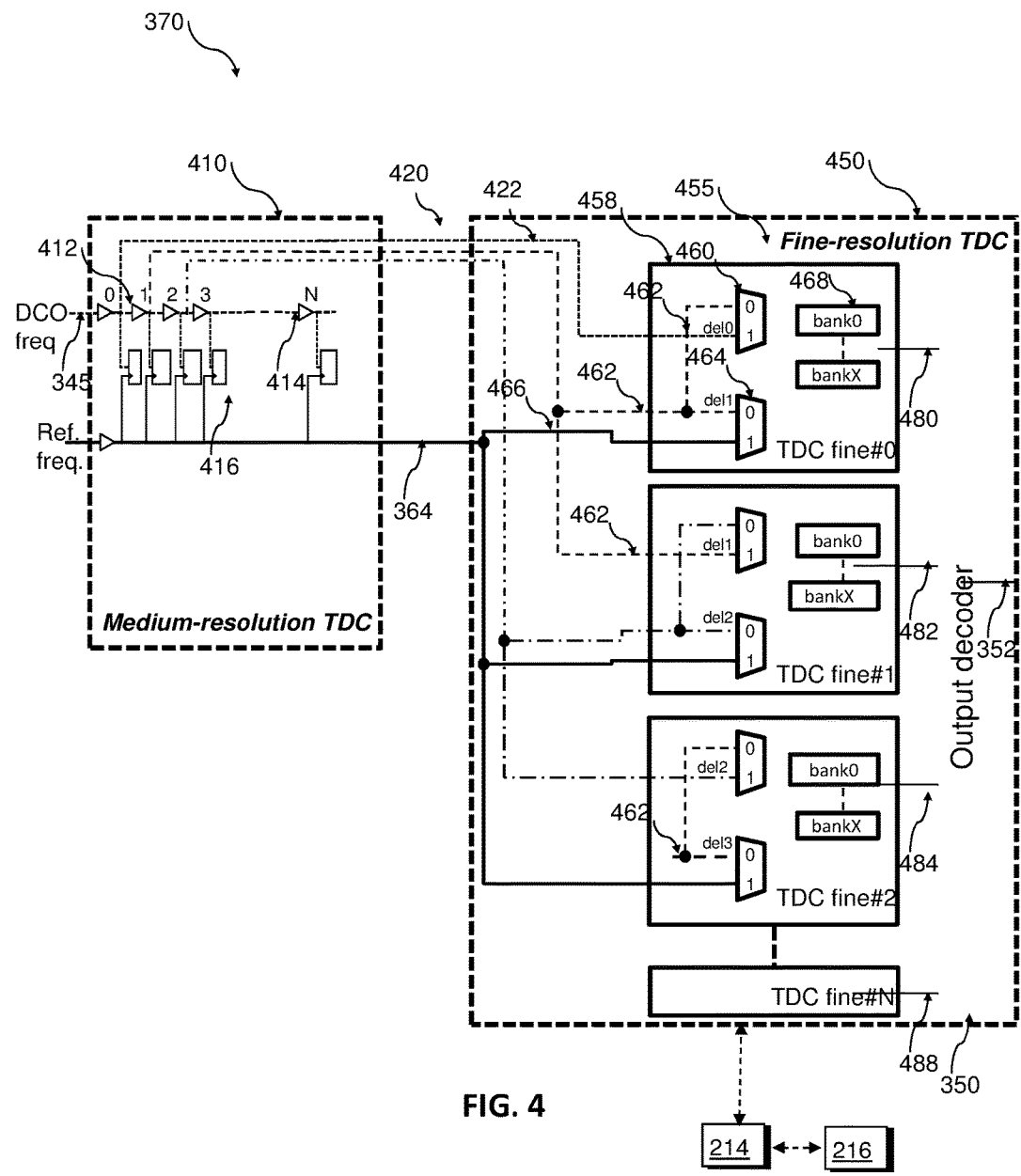
FIG. 4 illustrates a more detailed example of the dual TDC circuit of the DPLL of FIG. 3, in accordance with examples of the invention.

Referring now to FIG. 4, a more detailed example of the dual TDC circuit 370 of the DPLL 300 of FIG. 3 is illustrated, in accordance with examples of the invention. In accordance with examples of the invention, the dual TDC circuit 370 that includes both a medium-resolution TDC circuit 410 that provides a resolution of at least one DCO period, and thereafter a fine-resolution TDC circuit 450 that provides an improved resolution, but where the period that is measured is only (at least) the time delay of the medium-resolution TDC. In this example, the fine-resolution TDC circuit 450 also incorporates the TDC decoder 350 that decodes the digital feedback signal and outputs the decoded digital feedback signal 352.

The medium-resolution TDC circuit 410 receives the reference (clock) frequency signal 364 that is used to sample the DCO frequency-divided signal 345. In this example, the medium-resolution TDC circuit 410 includes a sequence 412 ('0' to 'N') of delay elements 414, which in some examples are logic buffers. In this example, an output from each of the delay elements 414 is provided to a respective, companion individual delay cell of the fine-resolution TDC circuit 450. In this example, the outputs from each of the delay elements 414 are time co-ordinated by a series of flip-flops 416 that use the reference (clock) frequency signal 364 for sampling the DCO frequency-divided signal 345.

The medium-resolution TDC circuit 410 aims to measure the oscillation period of the DCO frequency-divided signal 345 using the reference frequency period as a reference, and generates output codes that are representative of the input delay between the DCO signal and the reference signal. Thus, at each reference clock cycle, the DCO frequency-divided signal 345 is sampled to extract the delay between the reference (clock) frequency signal 364 and the DCO frequency-divided signal 345. In this example, the sampling is performed through the series of flip-flops 416 in order to generate the codes that represent the measured delay. The individual delay cells of the sequence 412 ('0' to 'N') of delay elements 414, each operate at a medium resolution, for example in the order of magnitude of one or more unit inverter delay in the used technology. Thus, in this manner, the medium-resolution TDC circuit 410 covers at least one period of the DCO frequency-divided signal 345.

In the context of this invention, the operation of the medium-resolution TDC circuit 410 performs a first, coarse measurement that may be additionally used at a system level elsewhere in the communication unit, such as communication unit 200 of FIG. 2. In this manner, time information between the reference (clock) frequency signal 364 and the DCO frequency-divided signal 345 is obtained.

Thereafter, the number of individual delay cells of the medium-resolution TDC circuit 410 route their output signals to a corresponding companion individual delay cell of the fine-resolution TDC circuit 450. Thus, accurate time information is provided by the fine-resolution TDC circuit 450, where the resolution is far below the unit inverter delay available in the technology, but the period that is measured is only (at least) the time delay of the medium-resolution TDC unit delay cell. This fine-resolution TDC circuit 450 provides a resolution accuracy of, say, the order of picoseconds (TDC).

In examples of the invention, a medium-to-fine based TDC architecture is used. The medium-resolution TDC circuit 410 is used to perform a coarse measurement, for example, whereby a period of, say, 1 nsec. is used to measure the delay and is divided by, say, 25 medium delays of 40 psec. each (yielding a medium delay of =40 psec.). In this manner, the input and output of a single medium delay (e.g. buffer) drives the equivalent fine-resolution TDC cell 458 (fine #n) in which, for example, sixteen unit delays of 2.5 psec. (2.5*16=40 psec.) are defined. Thus, in this example, each fine-resolution TDC cell 458 (fine #n) has sixteen outputs. The delay from code to code is the TDC resolution, which is defined to 2.5 psec. In order to guarantee this resolution of 2.5 psec., over the long DCO period, each fine-resolution TDC cell 458 may be first calibrated, for example in accordance with FIG. 8. The calibration is performed by using a Fast Flip Flop (FFF), such as FFF 546 in FIG. 5. In this manner, only the output from the fine-resolution TDC circuits 450 is processed as the information from the medium-resolution TDC circuit 410 is included in the fine-resolution TDC circuit 450.

The fine-resolution TDC circuit 450 includes a series 455 of parallel corresponding companion individual delay cells (TDC fine #0 to TDC fine #N). In this example, each fine-resolution TDC individual delay cell includes two multiplexers at the input, e.g. multiplexers 460, 464 in first fine-resolution individual delay cell (TDC fine #0) 458. The two multiplexers 460, 464 are configured to enable respective, per cell, bank calibration circuits 468 to more accurately align the reference (clock) frequency signal 364 and the DCO frequency-divided signal 345. This more accurate alignment is achieved by obtaining a code from each of the fine-resolution TDC individual delay cells), which guarantees the alignment, say within 1 psec.).

Figure 8:
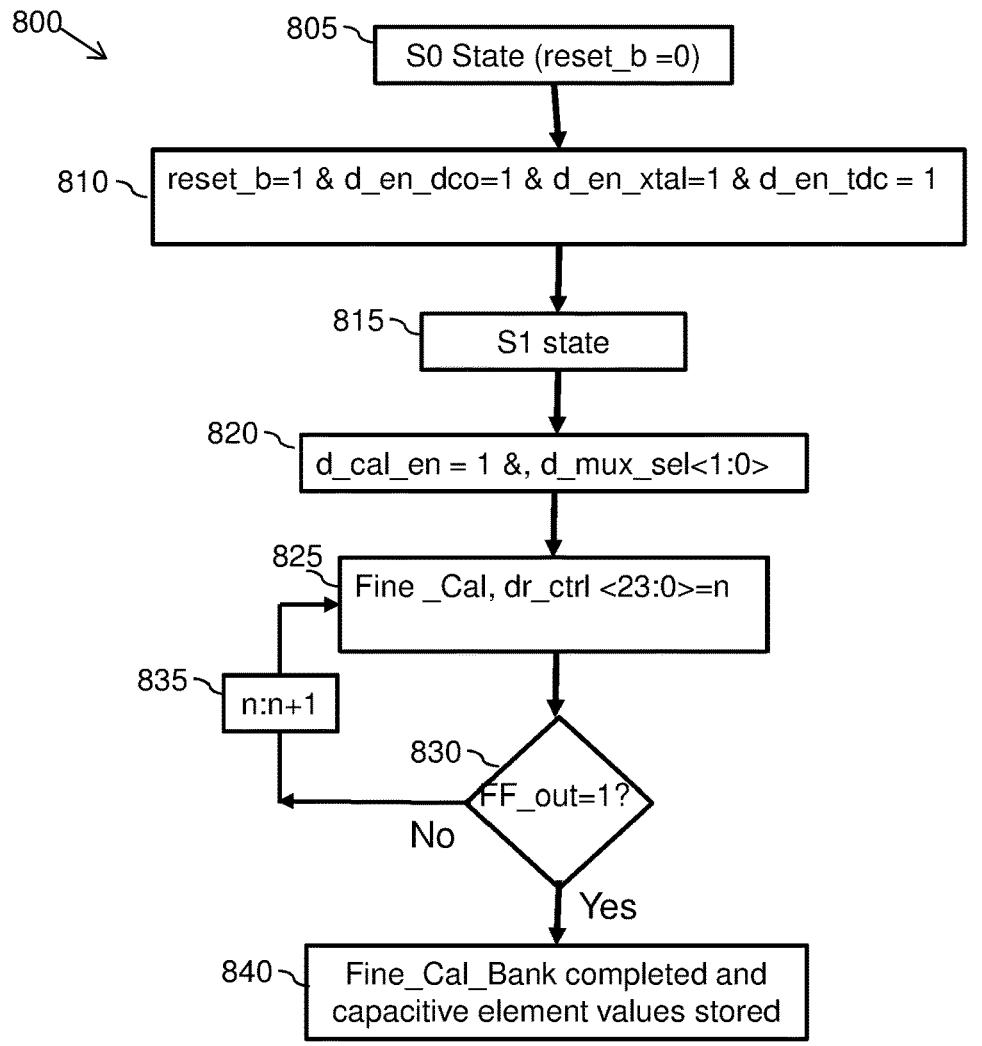
FIG. 8 illustrates a simplified flowchart of an example of a TDC calibration in a digital synthesizer, in accordance with examples of the invention.
Figure 8:
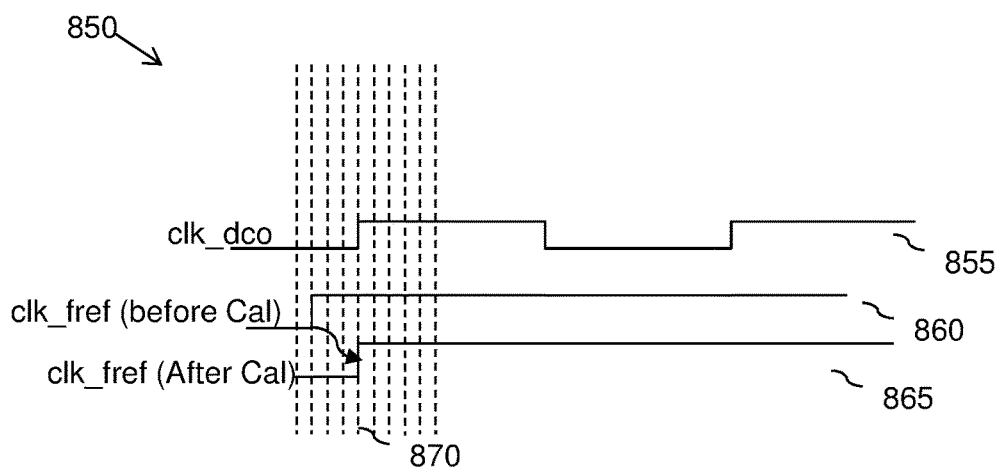

In this example, each bank calibration circuit 468 includes, say, eight capacitors reserved for the calibration mode of operation (for example as illustrated in FIG. 8) and sixteen capacitors reserved for a functional mode of operation. A calibration mode may be used to guarantee a high TDC resolution (of, say, 2.5 psec.) and a normal/functional mode may be used where the TDC is operating normally (e.g. measuring a delay between the reference signal 364 and the DCO signal (or DCO frequency-divided signal 345).

Figure 5:
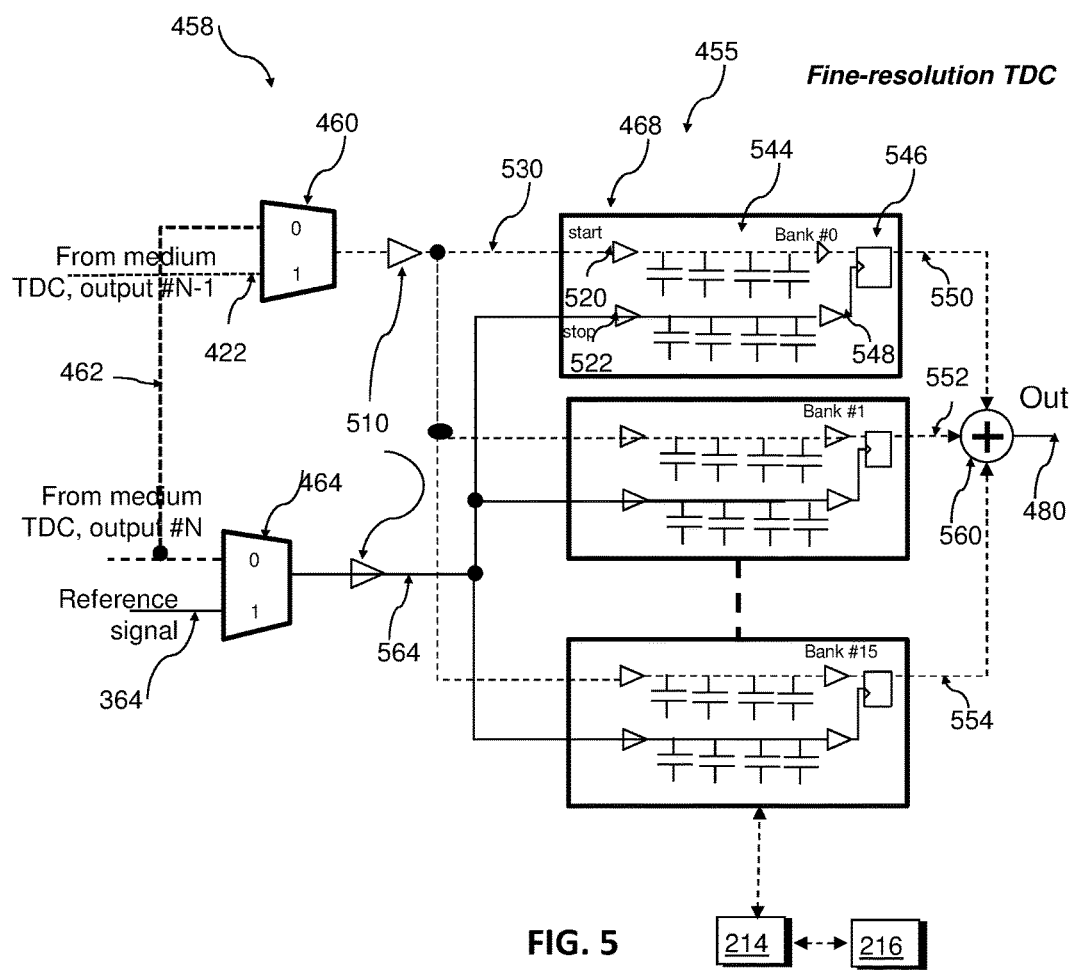
FIG. 5 illustrates a more detailed example of the fine-resolution aspect of the TDC circuit of the DPLL of FIG. 4, in accordance with examples of the invention.

In this example, the two multiplexers 460, 464 are configured to send the same sampled signal 462 (sampled from one of the medium-resolution TDC delay elements 414) to the paths of the reference (clock) frequency signal 364 and the medium-resolution TDC sampled DCO frequency-divided signals 420 as described with respect to FIG. 5.

Each cell of the fine-resolution TDC circuit 450 outputs a respective code 480, 482, 484, 488 to the output decoder 350 which generates therefrom a decoded digital feedback signal 352, namely a more accurate output code that is representative of the input delay between the DCO frequency-divided signal 345 and the reference (clock) frequency signal 364. Thus, the decoder output 352 corresponds to the delay between the DCO frequency-divided signal 345 and the reference frequency signal 364.

In some examples, it is envisaged that an intelligent matching of elements in the bank capacitors 468 may be employed, for example during a normal mode of operation. In some examples, a controller, such as controller 214 in FIG. 2, may be used to implement a dynamic element matching (DEM) algorithm in order to control or select one or more capacitive element(s) in bank capacitors 468 in the fine-resolution TDC 450. The DEM algorithm, and/or capacitive data relating thereto, may be stored in memory, such as in memory device 216 in FIG. 2. In this example, with one fine-resolution TDC such as fine #n, sixteen capacitor banks 468 are used to measure one medium delay with bank0 defining 1 lsb delay (i.e. '1' capacitor element is 'ON') . . . and bank15 defining a 16 lsb delay (i.e. 16 capacitor elements are 'ON'). In this manner, the DEM algorithm is coded in the controller 214 in such a way that the selected capacitor elements are different at each clock cycle of the reference signal 364. For example, the selected capacitor of bank0 (1 capacitor element among sixteen capacitor elements) is different at each clock cycle of the reference signal 364. In such a way, any mismatch between capacitive elements is removed, as they are averaged over time.

In this manner, dynamic element matching of components in the bank capacitors 468 may allow a significant improvement in the linearity of the output signal from the TDC circuit 370. For example, at a given time in each clock cycle, 'n' capacitive elements may be selected from 'X' selectable elements that are available in one or more of the bank capacitors 468. In some examples, when a variation of location of the capacitive elements that are selected is made, the output signal may benefit from an effect of averaging the output signal, thereby improving the linearity.

FIG. 5 illustrates a more detailed example of a first fine-resolution individual delay cell (TDC fine #0) 458 of the fine-resolution TDC circuit of FIG. 4, in accordance with examples of the invention. The two multiplexers 460, 464 are configured to send the same sampled signal 462 (sampled from one of the medium-resolution TDC delay elements 414) to the paths of a sampled reference (clock) frequency signal 564 and the sampled DCO frequency-divided signal 530, which in this example is from the medium-resolution TDC output #N−1. These signals are passed through the two respective single ended buffers 510 driving the 'start' input pin 520 and 'stop' input pin 522 of each of the bank capacitors 468. Both the sampled DCO frequency-divided signal passed through the 'start' input pin 520 and the sampled reference (clock) frequency signal passed through the 'stop' input pin 522 pass through a capacitor bank 544.

In this example, capacitor bank 544 includes two independent capacitor banks, one in the DCO and one in the reference path. In one example, 24 bits (to drive 24 capacitors) are used on each path. In such an example, sixteen capacitors are used in a 'normal' functional mode of operation and eight capacitors are reserved for the calibration mode of operation. In one example, an offset on the DCO path may be defined (whereby, say, 4 capacitors are always configured to be 'ON') in order to define the delay compared to the reference. In this manner, it is possible to calibrate the fine-resolution TDC circuit 458 in accordance with the flowchart of FIG. 8.

An accurate fast flip flop (FFF) 546 is used to guarantee the alignment by looking to its output whilst playing on the bank of capacitors 544. When a transition occurs ('0'→'1') at the output of the FFF 546, a code output 550, 552, 554 is obtained that guarantees that the output 480 is code aligned between the two signals, say, within 1 psec.

In some examples, the code output 550, 552, 554 for the alignment may be different from capacitor bank to capacitor bank, due to device mismatch. Once the calibration of each of the capacitor banks is completed, the summed output 480 from the summation 560 of the code outputs 550, 552, 554 of the fine-resolution TDC circuit 458 is configured to cover, in this example, 16*TDC_resolution (TDC_resolution=2.5 psec.) through Bank #0 . . . Bank #15. In this example, we define: 1 least significant bit (LSB) on Bank #0, 2 LSB on Bank #1 . . . 16 LSB on Bank #15, thereby providing a total TDC_resolution equivalent to '1' LSB.

Again, in some examples, a controller, such as controller 214 in FIG. 2, may be used to implement a dynamic element matching (DEM) algorithm in order to control or select one or more capacitive element(s) in bank capacitors 544 in the fine-resolution TDC 458. The DEM algorithm, and/or capacitive data relating thereto, may be stored in memory, such as in memory device 216 in FIG. 2.

Examples of the invention, as illustrated in the simplified circuit diagrams of FIG. 4 and FIG. 5, include a limited number of flip-flops and gate, whereas, in practice, the gates may be formed of many more flip-flops and groups of gates, or other logic elements, as the digital code information is made of several bits.

Figure 6:
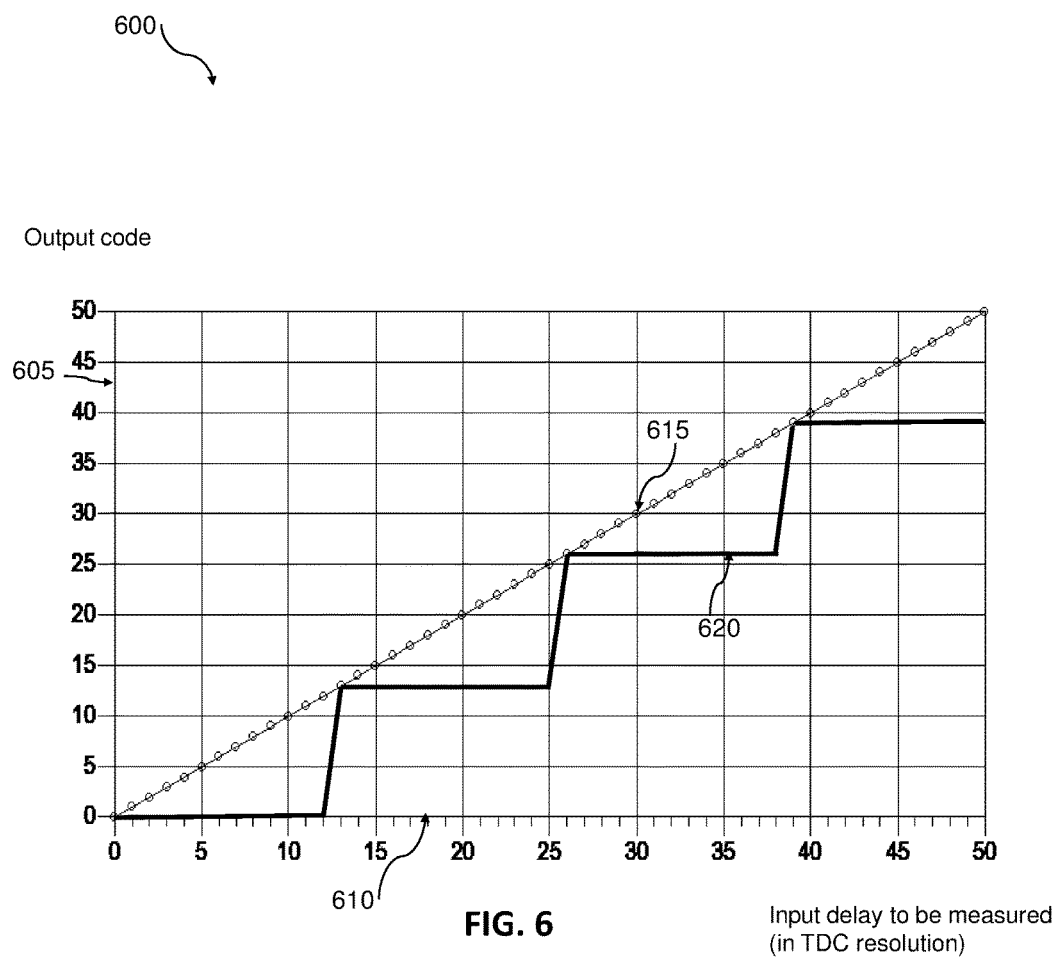
FIG. 6 illustrates a system simulation example of a response of the known medium-resolution TDC versus a response according to examples of the invention.

Referring now to FIG. 6, a system simulation 600 example of the response of the known medium resolution TDC operation as well as the improved fine-resolution TDC is illustrated, according to examples of the invention. The graph illustrates n*lsb =1 for a medium resolution. The simulation 600 includes a graph of output code 605 versus the input delay 610 to be measured in a TDC resolution. The simulation 600 shows the medium TDC response versus the input delay with a TDC resolution 620. As clearly illustrated, this is a coarse measurement of the delay which is not linear and may generate in band phase noise degradation at PLL output. The graph 615 also shows a fine-resolution example of the invention, according to the examples of FIG. 3, FIG. 4 and FIG. 5 and provides a linear response.

Figure 7:
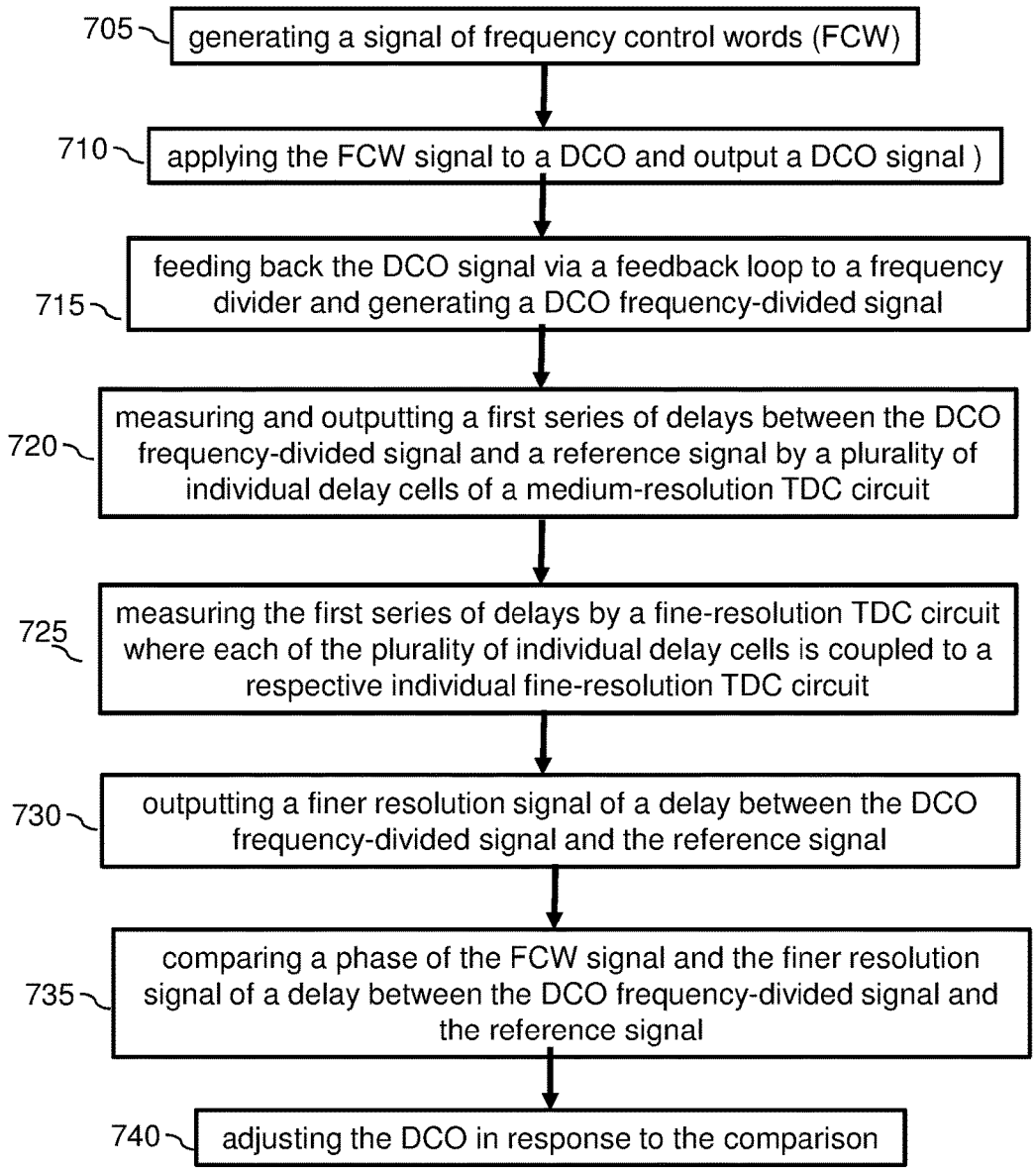
FIG. 7 illustrates a simplified flowchart of an example of a method of operating a dual TDC circuit in a digital synthesizer, in accordance with examples of the invention.

Referring now to FIG. 7, a simplified flowchart 700 of an example of a method of performing time-to-digital conversion in a digital synthesizer is illustrated, in accordance with examples of the invention. The flowchart 700 includes, at 705, generating a signal (e.g. signal 307 of FIG. 3) of frequency control words, FCW, that describes a desired frequency modulated continuous wave. At 710, the FCW signal is applied to a digitally controlled oscillator and a DCO signal (e.g. signal 335 of FIG. 3) outputted. At 715, the flowchart includes feeding back the DCO signal via a feedback loop to a frequency divider (340), and generating a DCO frequency-divided signal (e.g. signal 345 of FIG. 3) from the DCO signal. In some examples, a representation of the DCO signal itself may be used, which in some examples may be the frequency-divided DCO signal of 715. At 720, the flowchart includes measuring and outputting a first series of delays between the DCO frequency-divided signal and a reference signal (e.g. signal 364 of FIG. 3) by a plurality of individual delay cells of a medium-resolution TDC circuit (e.g. medium-resolution TDC circuit 410 of FIG. 4). At 725, the flowchart includes measuring the first series of delays by a fine-resolution TDC circuit where each of the plurality of individual delay cells is coupled to a respective individual cells of a fine-resolution TDC circuit (e.g. cells 458 of fine-resolution TDC circuit 458 of FIG. 4), and outputting (730) a finer resolution signal of a delay between the DCO frequency-divided signal and the reference signal. At 735, the flowchart includes comparing a phase of the FCW signal and the finer resolution signal of a delay between the DCO frequency-divided signal and a reference signal. At 740, the flowchart includes adjusting the DCO signal in response to the comparison.

Referring now to FIG. 8, a simplified flowchart 800 illustrates an example of a TDC calibration in a digital synthesizer, in accordance with examples of the invention. In this calibration mode of operation, the circuits of FIGS. 3, 4 and 5 may be used. The calibration mode of operation includes selecting and introducing a selected at least one of the capacitive elements into either a reference frequency signal path or a DCO signal path; determining whether signals applied to the reference frequency signal path and DCO signal path are time aligned; and storing the capacitive element data (for example in memory device 216 of FIG. 2) when the reference frequency signal path and DCO signal path are time aligned.

In this calibration mode of operation, the fine-resolution TDC circuit, such as fine-resolution TDC circuit 458 of FIG. 4 and FIG. 5, is reset at 805 and the crystal oscillator and the DCO and TDC circuits enabled in 810. The circuit then transitions to a calibration state/mode of operation in 815 and, at 820, the calibration mode is enabled and the multiplexers, such as multiplexers 460, 464 of FIG. 4 and FIG. 5 also enabled.

One of the capacitive elements in the reference frequency path is selected and introduced into the reference frequency path, thereby delaying the reference signal by a unit amount. A determination is then made at 830 as to whether a time delay exists between the representation of the DCO signal (e.g. the frequency-divided sampled DCO signal 530) and the reference frequency 364, for example whether the fast flip-flop, e.g. FFF 546 from FIG. 5, has triggered and output a '1'. This situation is indicated in the timing diagram of 850, whereby there is a delay of three units between the representation of the DCO signal 855 and the clock reference frequency 860. If not, the flowchart moves to 835, where a new capacitive element is enabled. The flowchart then loops to 825 and then a further determination of whether the FFF triggers and outputs a '1' is made in 830. This process continues until a suitable selected capacitive element is selected and the determination at 830 is that the FFF triggers and outputs a '1'. The process then ends at 840 with the fine-resolution capacitor bank being calibrated. This timing scenario is indicated at 870, with the representation of the DCO signal 855 and the delayed clock reference frequency 865 after calibration being time aligned.

Although this example has been described with reference to delays being introduced into the reference frequency path with the use of capacitive elements, it is envisaged that in other examples, the delays may be introduced into the DCO signal path to ultimately align the delayed DCO signal path to the reference frequency path.

Thus, in this manner, a medium-resolution TDC circuit measures a first series of delays between a representation of the DCO signal, which in some examples is a frequency-divided DCO signal, and a reference signal that covers at least one DCO period in order to provide a coarse accuracy. Each individual cell of the medium-resolution TDC circuit is combined with a fine-resolution TDC that achieves a resolution that is far below the individual inverter delay available in the technology that is used in the DPLL. In this manner, a synergistic benefit from the use of both TDC circuits may be achieved.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented that achieve the same functionality.

Any arrangement of components to achieve the same functionality is effectively 'associated', such that the desired functionality is achieved. Hence, any two components herein combined to achieve a particular functionality can be seen as being 'associated with' each other, such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be executed at least partially overlapping in time. Moreover, alternative example embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in wireless programmable devices or units able to perform the desired device functions by operating in accordance with suitable program code.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one, or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digital synthesizer comprising:
a ramp generator configured to generate a signal of frequency control words, a FCW signal, that describes a desired frequency modulated continuous wave;
a digitally controlled oscillator, DCO, configured to receive the FCW signal and output a DCO signal;
a feedback loop comprising a dual time-to-digital converter, TDC, circuit configured to measure a delay between a representation of the DCO signal and a reference signal, where the TDC circuit comprises a medium-resolution TDC circuit coupled to a fine-resolution TDC circuit; and
a phase comparator coupled to the ramp generator and configured to compare a phase of the FCW signal output from the ramp generator and a signal fed back from the DCO via the feedback loop and output a N-bit oscillator control signal;
wherein the digital synthesizer is characterised in that the medium-resolution TDC circuit comprises a plurality of individual delay cells, where each of the plurality of individual delay cells is coupled to a respective individual fine-resolution TDC circuit, and the fine-resolution TDC circuit comprises individual delay cells, each individual delay cell comprising:
two multiplexers at an input, and
per cell bank calibration circuits, wherein the two multiplexers are configured to enable a respective per cell bank calibration circuit to more accurately align the reference frequency signal and the representation of the DCO signal.

2. The digital synthesizer of claim 1, wherein the fine-resolution TDC circuit comprises a plurality of individual delay cells as a corresponding companion to each individual delay cell of the medium-resolution TDC circuit.

3. The digital synthesizer of claim 1, wherein each respective individual fine-resolution TDC circuit measures the delay between the representation of the DCO signal and the reference signal within a period substantially representative of a time delay of a medium-resolution TDC circuit delay cell.

4. The digital synthesizer of claim 3, wherein the medium-resolution TDC circuit comprises a number of individual delay cells, and is configured to measure a delay at a medium resolution on an order of one or more individual inverter delays.

5. The digital synthesizer of claim 1, wherein the plurality of individual delay cells medium-resolution TDC circuit comprises a sequence of delay elements that are logic buffers.

6. The digital synthesizer of claim 1, wherein the medium-resolution TDC circuit comprises a series of flip-flops and sampling of the representation of the DCO signal is performed through the series of flip-flops in order to generate a first representation of codes that represent a first coarse measurement of the delay between the representation of the DCO signal and a reference signal.

7. The digital synthesizer of claim 6, wherein the fine-resolution TDC circuit comprises a plurality of individual delay cells and each of the plurality of individual delay cells of the fine-resolution TDC circuit includes a respective one of the per cell bank calibration circuits with a series of capacitor banks, wherein each capacitor bank is arranged to receive one of the first representation of codes to thereby more accurately align the reference (clock) frequency signal and the representation of the DCO signal.

8. The digital synthesizer of claim 7, wherein capacitive elements in a plurality of the capacitor banks are dynamically selectable in order to generate a variable TDC output code.

9. The digital synthesizer of claim 8, wherein capacitive elements of each capacitor bank are selected based on a linearity requirement of the TDC output code.

10. The digital synthesizer of claim 1 wherein the medium-resolution TDC circuit is configured to provide a resolution of at least one period of a DCO output signal.

11. The digital synthesizer of claim 1, wherein the feedback loop comprises a frequency divider configured to generate a DCO frequency-divided signal from the DCO signal; and the dual TDC circuit is configured to measure a delay between the DCO frequency-divided signal and the reference signal.

12. A communication unit having a digital synthesizer comprising:
a ramp generator configured to generate a signal of frequency control words, a FCW signal, that describes a desired frequency modulated continuous wave;
a digitally controlled oscillator, DCO, configured to receive the FCW signal and output a DCO signal;
a feedback loop comprising a dual time-to-digital converter, TDC, circuit configured to measure a delay between a representation of the DCO signal and a reference signal, where the TDC circuit comprises a medium-resolution TDC circuit coupled to a fine-resolution TDC circuit; and
a phase comparator coupled to the ramp generator and configured to compare a phase of the FCW signal output from the ramp generator and a signal fed back from the DCO via the feedback loop and output a N-bit oscillator control signal;
wherein
the digital synthesizer is characterised in that the medium-resolution TDC circuit comprises a plurality of individual delay cells, where each of the plurality of individual delay cells is coupled to a respective individual fine-resolution TDC circuit, and
the fine-resolution TDC circuit comprises a plurality of individual delay cells and each of the plurality of individual delay cells of the fine-resolution TDC circuit includes a series of capacitor banks, each capacitor bank is arranged to receive the representation of the DCO signal and a reference signal.

13. A method for performing time-to-digital conversion in a digital synthesizer, the method comprising:
generating a signal of frequency control words, a FCW signal, that describes a desired frequency modulated continuous wave;
applying the FCW signal to a digitally controlled oscillator and outputting a DCO signal;
feeding back the DCO signal via a feedback loop to a frequency divider;
measuring and outputting a first series of delays between a representation of the DCO signal and a reference signal by a plurality of individual delay cells of a medium-resolution TDC circuit;
measuring the first series of delays by a fine-resolution TDC circuit where each of the plurality of individual delay cells is coupled to a respective individual fine-resolution TDC circuit, and outputting a finer resolution signal of a delay between the representation of the DCO signal and the reference signal, wherein the fine-resolution TDC circuit comprises a plurality of capacitive elements within a series of capacitor banks;

comparing a phase of the FCW signal and the finer resolution signal of a delay between the representation of the DCO signal and a reference signal; and adjusting the DCO output signal in response to the comparison.

14. The method of claim 13 when in a calibration mode of operation the method further comprises:

selecting and introducing a selected at least one of the capacitive elements into either a reference frequency signal path or a DCO signal path;

determining whether signals applied to the reference frequency signal path and DCO signal path are time aligned; and storing the capacitive element data when the reference frequency signal path and DCO signal path are time aligned.

* * * * *